US009299922B1

(12) United States Patent
Abuelma'atti et al.

(10) Patent No.: US 9,299,922 B1
(45) Date of Patent: Mar. 29, 2016

(54) CONTINUOUS-LEVEL MEMRISTOR EMULATOR

(71) Applicant: KING FAHD UNIVERSITY OF PETROLEUM AND MINERALS, Dhahran (SA)

(72) Inventors: Muhammad Taher Abuelma'atti, Dhahran (SA); Zainulabideen Jamal Khalifa, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 14/748,202

(22) Filed: Jun. 23, 2015

(51) Int. Cl.
*G06G 7/12* (2006.01)
*H01L 43/08* (2006.01)
*H03F 3/45* (2006.01)

(52) U.S. Cl.
CPC . *H01L 43/08* (2013.01); *H03F 3/45* (2013.01)

(58) Field of Classification Search
None
See application file for complete search history.

(56) References Cited

U.S. PATENT DOCUMENTS

2011/0204310 A1* 8/2011 Strachan ................ B82Y 10/00 257/2
2014/0282314 A1 9/2014 Mohanty et at.

FOREIGN PATENT DOCUMENTS

CN 103297025 A 9/2013
CN 103729518 A 4/2014

OTHER PUBLICATIONS

Sanchez-Lopez et al., "A floating analog memristor emulator circuit," IEEE Transactions on Circuits and Systems—II: Express Briefs, vol. 61, pp. 309-313, Apr. 22, 2014.
Yeçil et al., "A new DDCC based memristor emulator circuit and its applications," Microelectronics Journal, vol. 45, Issue 3, pp. 282-287, Mar. 2014.

* cited by examiner

*Primary Examiner* — Daniel Puentes
(74) *Attorney, Agent, or Firm* — Richard C. Litman

(57) ABSTRACT

The continuous-level memristor emulator is a circuit that uses off-the-shelf components to emulate a memristor. The circuit uses two current-feedback operational-amplifiers (CFOAs) and uses an operational transconductance amplifier (OTA)-based circuit in place of a diode resistive network to provide a continuous level of memristance instead of two binary states. The OTA is forced to work in its nonlinear region by the voltage $V_{DC}$ applied to its positive input terminal. Thus, the transfer function of the OTA-based circuit will be a non-linear function. Experimental testing shows that the continuous-level memristor emulator is operational as a memristor, and the emulator may be used, e.g., in place of a memristor in a multivibrator circuit.

9 Claims, 8 Drawing Sheets

900

1000

CONTINUOUS-LEVEL MEMRISTOR EMULATOR

BACKGROUND OF THE INVENTION

1. Field of the Invention

The present invention relates to memristor emulators, and particularly to a continuous-level memristor emulator and its use in a multivibrator circuit.

2. Description of the Related Art

A memristor is a passive device that relates magnetic flux to current charge. Until 2008, the existence of the device was only theoretically postulated. In 2008, a team from Hewlett Packard claimed to have developed the device from a thin film of titanium dioxide. However, the device is not currently commercially available. There has been a great deal of interest in the device. Due to its unavailability, a great many circuits that emulate the properties of the device have been developed. The present inventors have developed memristor emulator circuits using current-feedback operational-amplifiers (CFOAs). However, these circuits have typically employed diode-resistive networks for implementing the required nonlinear resistances, and hence can provide only two values for the nonlinear resistances. Any type of binary memristor providing only two memresistance states is at a disadvantage.

Thus, a continuous-level memristor emulator solving the aforementioned problems is desired.

SUMMARY OF THE INVENTION

The continuous-level memristor emulator is a circuit that uses off-the-shelf components to emulate a memristor. The circuit uses two current-feedback operational-amplifiers (CFOAs) and uses an operational transconductance amplifier (OTA)-based circuit in place of a diode resistive network to provide a continuous level of memristance instead of two binary states. The OTA is forced to work in its nonlinear region by the voltage $V_{DC}$ applied to its positive input terminal. Thus, the transfer function of the OTA-based circuit will be a nonlinear function. Experimental testing shows that the continuous-level memristor emulator is operational as a memristor, and the emulator may be used, e.g., in place of a memristor in a multivibrator circuit.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

The continuous-level memristor emulator uses an operational transconductance amplifier (OTA)-based circuit connected to current feedback operational amplifiers (CFOAs), wherein the OTA is forced to work in its nonlinear region by the voltage $V_{DC}$ applied to its positive input terminal. Thus, the transfer function of the OTA-based circuit will be a nonlinear function. The continuous level memristor emulator 100 of FIG. 1 includes a first current feedback operational amplifier (CFOA1) 102*a*, a second CFOA 102*b* (CFOA2), an operational transconductance amplifier (OTA) 104 having a negative input, a positive input, and an output, the OTA negative input being connected to a w output terminal of the first CFOA 102*a*, the OTA output being connected to the y input terminal of the second CFOA 102*b*. A w terminal of second CFOA 102*b* is connected to the y terminal of the first CFOA 102*a*. Resistor $R_2$ is connected between ground and a control input of OTA 104. Resistor $R_3$ is connected between ground and the y terminal of the second CFOA 102*b*. Resistor $R_1$ is connected between ground and the z terminal of the second CFOA 102*b*. Capacitor $C_1$ is connected between ground and the z terminal of the first CFOA 102*a*. Capacitor $C_2$ is connected between ground and the x terminal of the second CFOA 102*b*. In the circuit of the present continuous level memristor emulator 100, the input current $i_M$ will be integrated by the capacitor $C_1$. Thus, the voltage at the negative input of the OTA 104 will be given by:

$$v_R = -\frac{1}{C_1}\int i_m\,dt. \tag{1}$$

This voltage will be processed by the nonlinear scalar formed of the OTA-based circuit. Thus, the output current of the OTA 104 will be given by:

$$i_R = F(v_R) = \frac{v_R}{R_{eq}}. \tag{2}$$

In equation (2) F is a nonlinear function representing the input-output relationship of the OTA-based circuit comprising the OTA 104, resistors $R_2$ and $R_3$, and the DC bias voltage $V_{DC}$. In order for the function F to be nonlinear, it is necessary to force the OTA 104 to work in its nonlinear region. This can be achieved by applying a relatively large bias voltage $V_{DC}$ at the positive input terminal of the OTA 104. In equation (2) $R_{eq}$ is the equivalent nonlinear resistance represented by the function $F(v_R)$. The voltage at terminal y of the CFOA 102*b* will be given by:

$$v_y = i_R R_3. \qquad (3)$$

This voltage will be differentiated by the capacitor $C_2$ to produce a voltage $v_M$ given by:

$$v_M = R_1 R_3 C_2 \frac{d i_R}{dt}. \qquad (4)$$

Figure 2A:
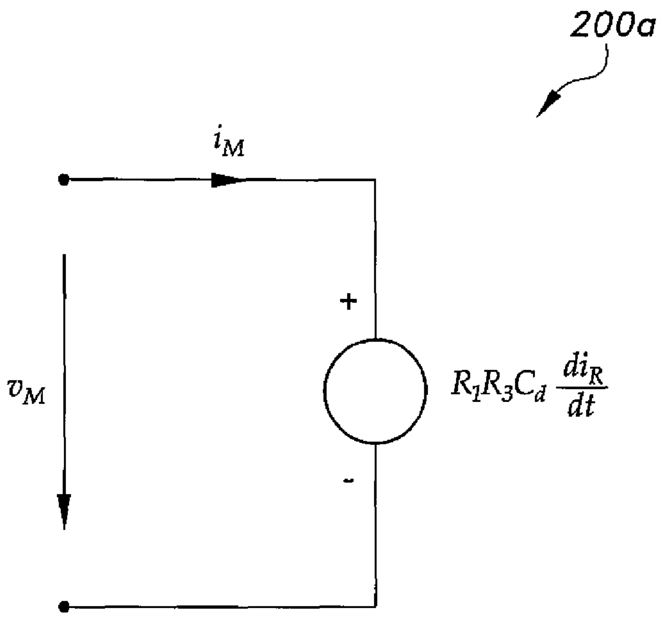
FIG. 2A is a schematic diagram of a memristor model that models input current, of a continuous-level memristor emulator according to the present invention.
Figure 2B:
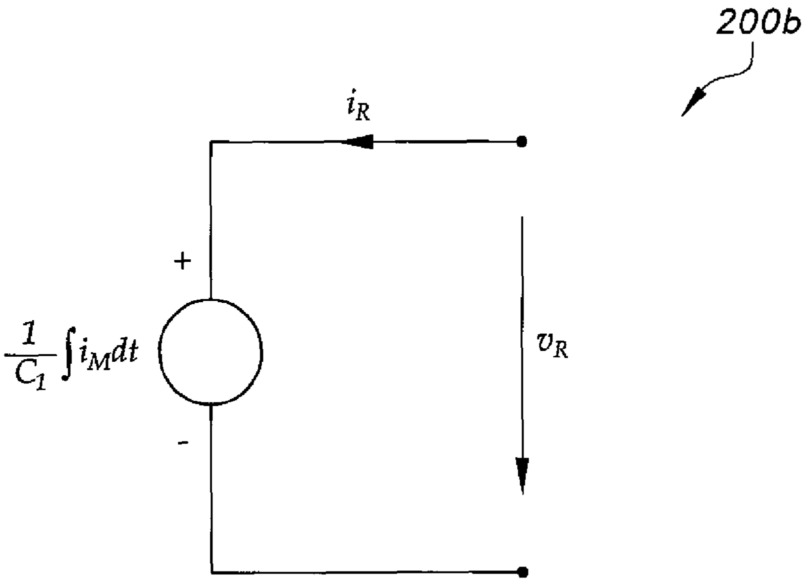
FIG. 2B is a schematic diagram of a memristor model that models output current, $i_R$, of a continuous-level memristor emulator according to the present invention.

Equations (1) and (4) can be represented by models 200*a* and 200*b*, as shown in FIGS. 2A and 2B. This is equivalent to transferring a current-controlled resistor into a flux-controlled memristor. If the input current $i_M$ is a sinusoidal current of the form $i_M = I_m \sin \omega t$, then using equations (1), (2) and (4), it is easy to show that the equivalent resistance of the memristor will be given by:

$$M = \frac{C_2 R_1 R_3}{C_1 R_{eq}}. \qquad (5)$$

Inspection of equations (2) and (5) shows that the memristance can acquire multiple values, so long as the function F is a continuous nonlinear function, which is the case.

Figure 1:
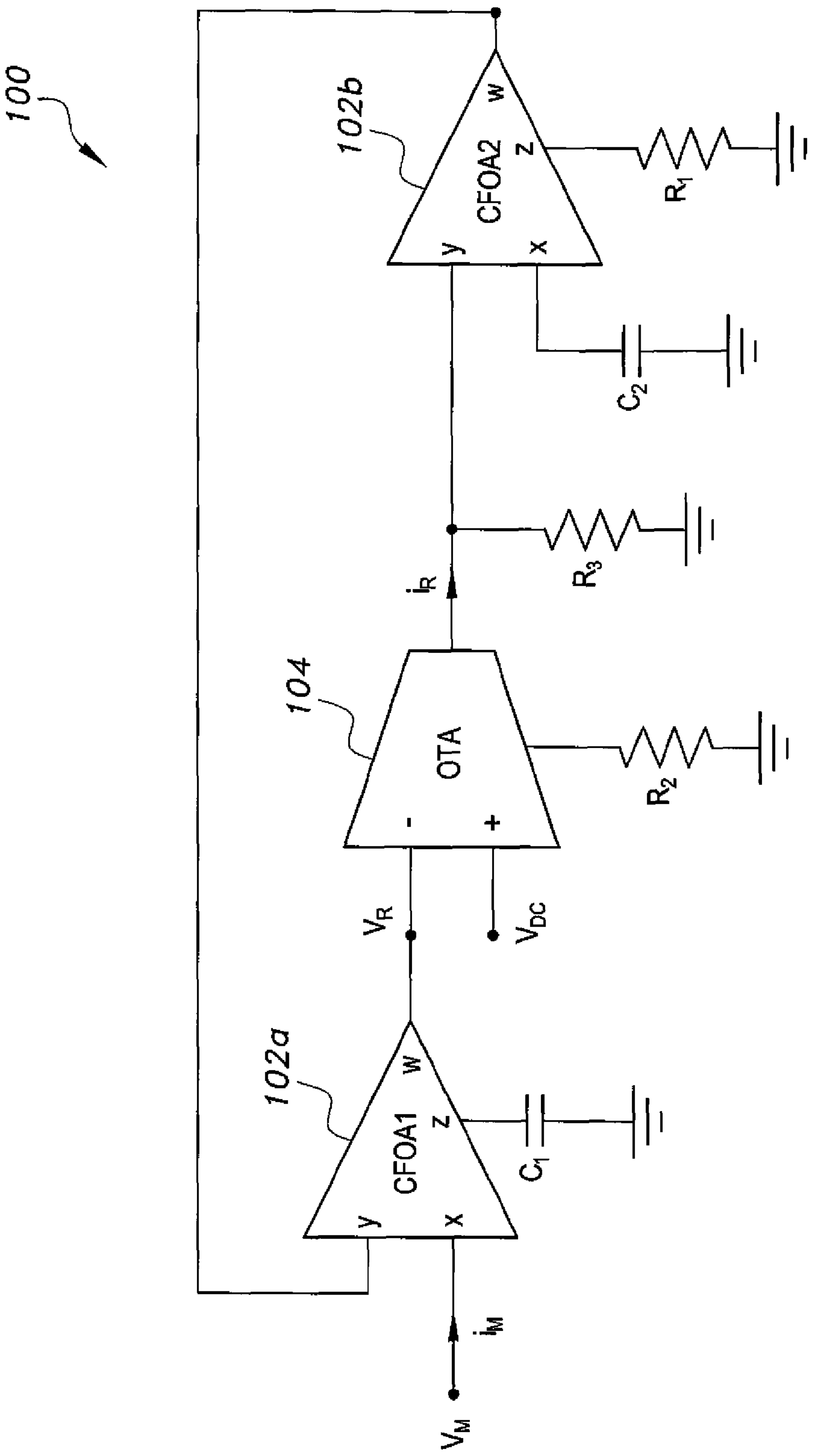
FIG. 1 is a schematic diagram of a continuous-level memristor emulator according to the present invention.
Figure 3:
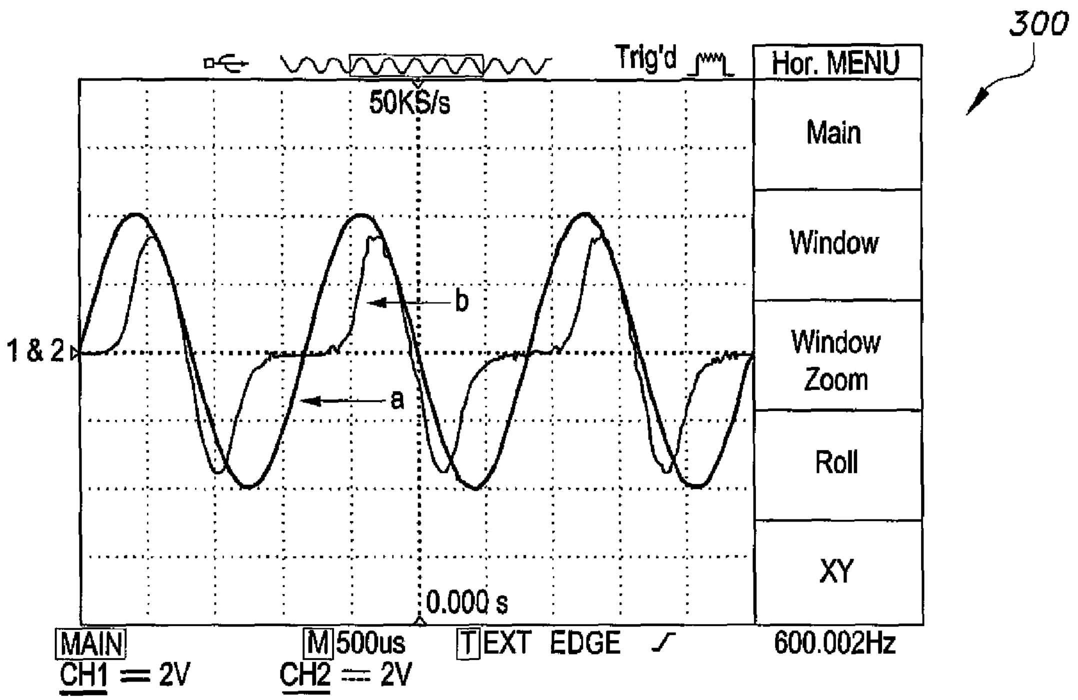
FIG. 3 is a plot showing the current (a) and the voltage (b) waveforms of the continuous-level memristor emulator according to the present invention.
Figure 4:
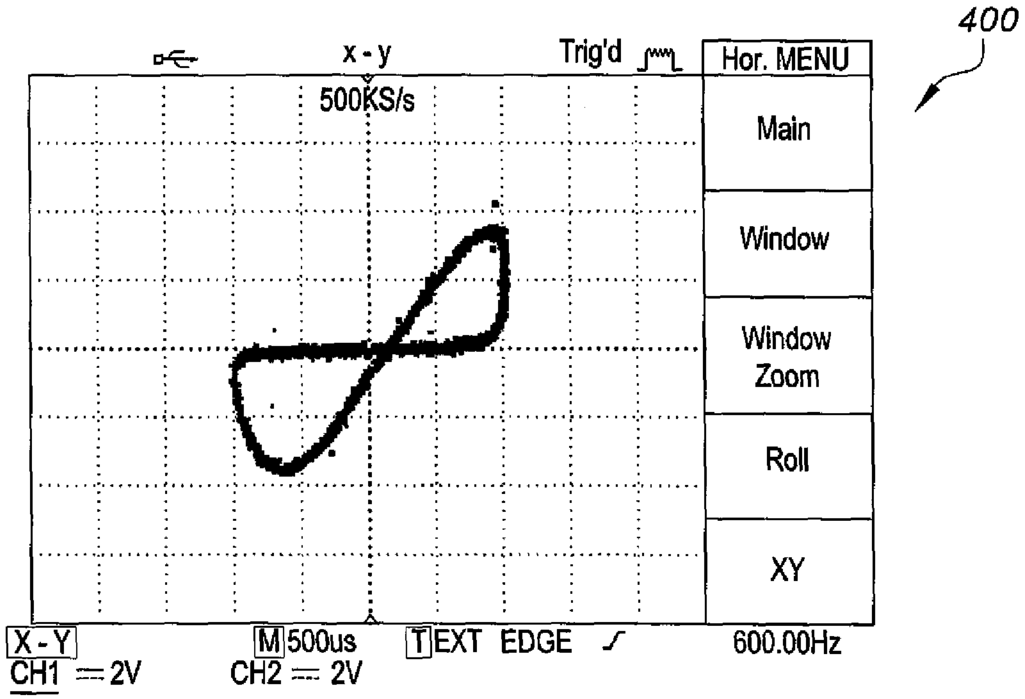
FIG. 4 is a plot showing current-voltage characteristics of the continuous-level memristor emulator according to the present invention.

The present continuous-level memristor emulator circuit 100 shown in FIG. 1 was experimentally tested using an off-the-shelf LM3080AN OTA and AD844 CFOAs. The results obtained with $C_1$=2.2 μF, $R_2$=100 kΩ, $R_3$=20 kΩ, $V_{DC}$=11.7V, $C_2$=2.2 μF, $R_1$=10 kΩ, and DC supply voltages=±12V are shown in plots 300 and 400 of FIGS. 3 and 4, respectively. These results confirm the operation of the continuous-level memristor emulator circuit 100 with the classical bow-tie shown in plot 400 of FIG. 4. In order to block possible high frequency oscillations, a capacitance of 1 nF may be connected in parallel with $R_1$.

Figure 5:
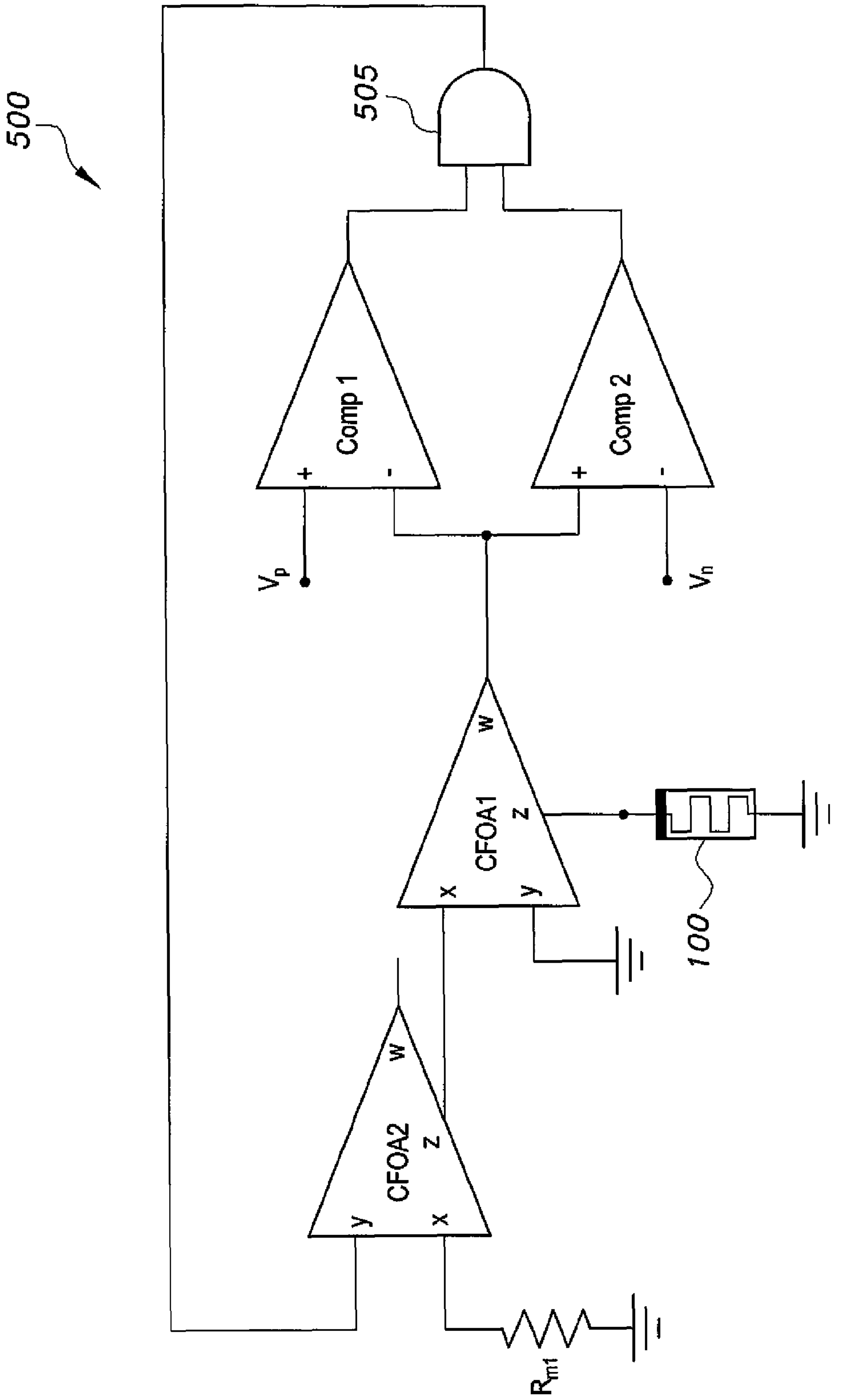
FIG. 5 is a schematic diagram of a multivibrator circuit using the continuous-level memristor emulator of FIG. 1 in the feedback loop.

The functionality of the present emulator circuit 100 was also tested by using it in a practical implementation of a multivibrator circuit 500, as shown in FIG. 5. The multivibrator circuit 500 is a complete circuit, including multivibrator current-feed operational amplifier CFOA2, multivibrator current-feed operational amplifier CFOA1, comparator 1 (Comp 1), and comparator 2 (Comp2) connected in a feedback circuit via AND gate 505 for oscillation. The continuous-level memristor emulator 100 is connected from ground to the z terminal of CFOA1. The proposed implementation uses AP358 comparators. More specifically, a resistor $R_{m1}$ is connected to the x terminal of multivibrator amplifier CFOA2, and as shown in FIG. 5, resistor $R_{m1}$ is connected from ground to the x terminal of multivibrator amplifier CFOA2. The z terminal of multivibrator amplifier CFOA2 is connected to the x terminal of multivibrator amplifier CFOA1. The memristor emulator 100 is connected from ground to the z terminal of multivibrator amplifier CFOA 1. The y terminal of multivibrator amplifier CFOA1 is connected to ground. The w terminal of multivibrator amplifier CFOA1 is connected to the inverting input of comparator Comp1 and to the non-inverting input of comparator Comp2. The positive (non-inverting input) terminal of comparator Comp1 has a positive reference voltage $v_p$ applied. The negative terminal (inverting input) of comparator Comp2 has a negative reference voltage $v_n$ applied. The outputs of comparators Comp1 and Comp2 feed respective inputs of the AND gate 505. The output of the AND gate 505 is connected to they terminal of multivibrator amplifier CFOA2.

Figure 6:
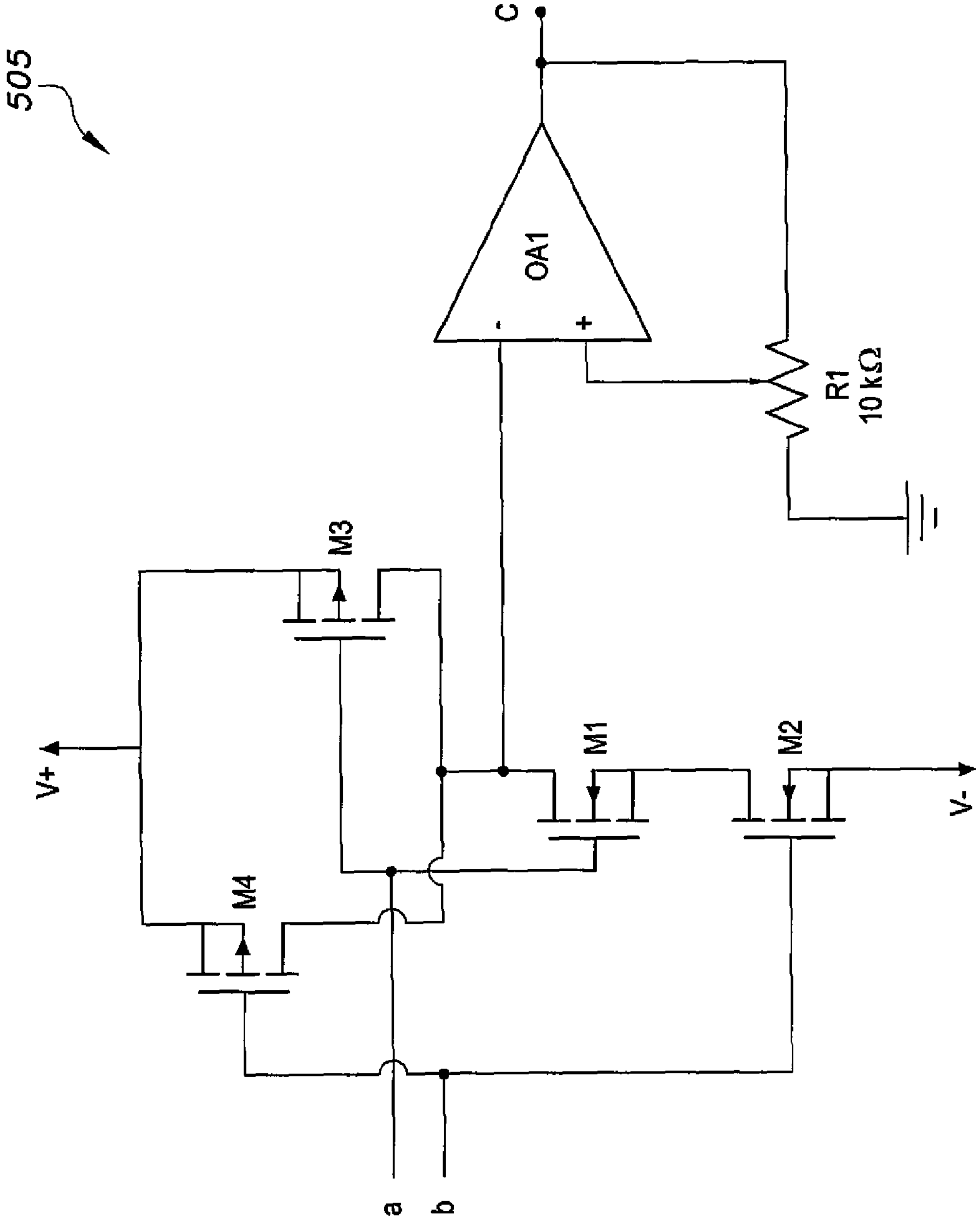
FIG. 6 is a schematic diagram showing a practical implementation of the AND gate of FIG. 5.
Figure 7:
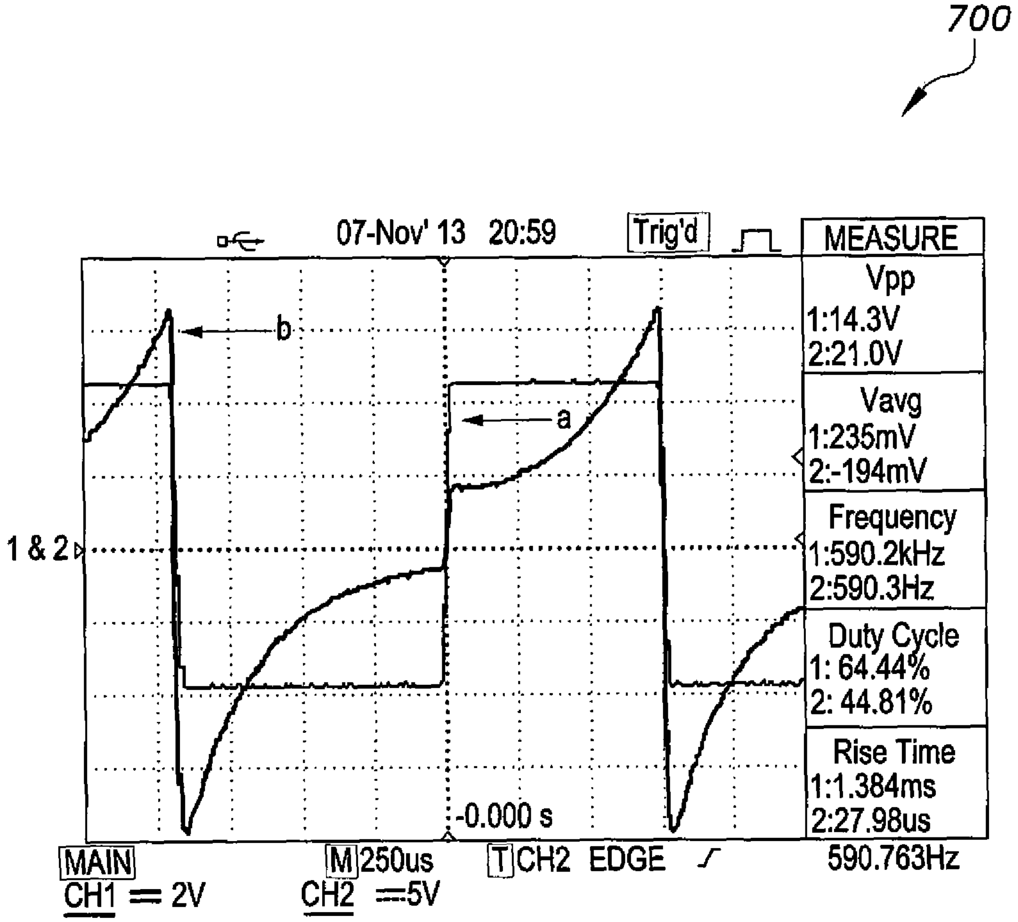
FIG. 7 is a plot showing typical voltage waveforms obtained from the multi-vibrator circuit of FIG. 5 (at the arrow labeled "a") and a voltage across the continuous-level memristor emulator in the circuit (at the arrow labelled "b").
Figure 8:
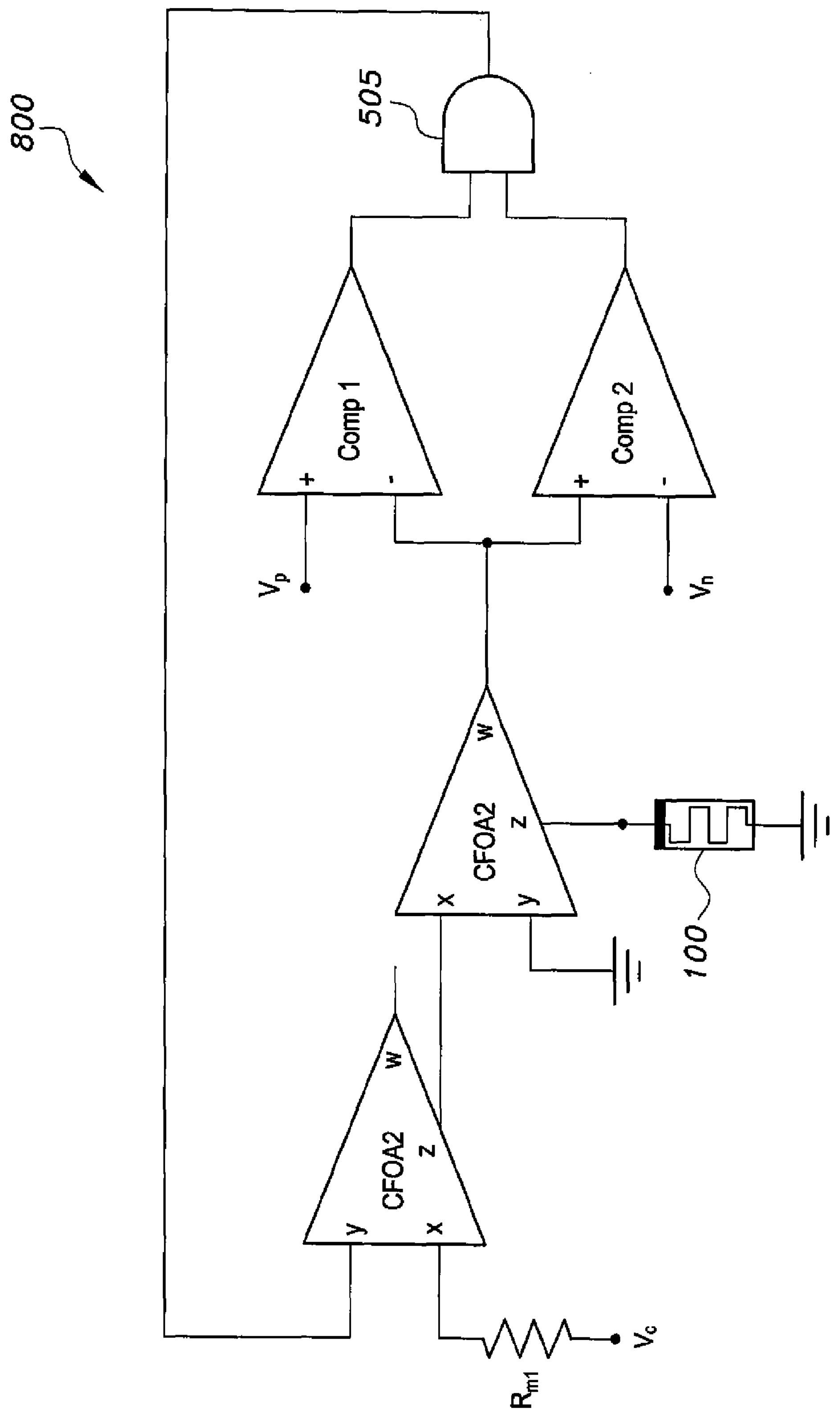
FIG. 8 is a schematic diagram of the multivibrator circuit of FIG. 5, but with a control voltage at the input to define a voltage-controlled multivibrator circuit.
Figure 9:
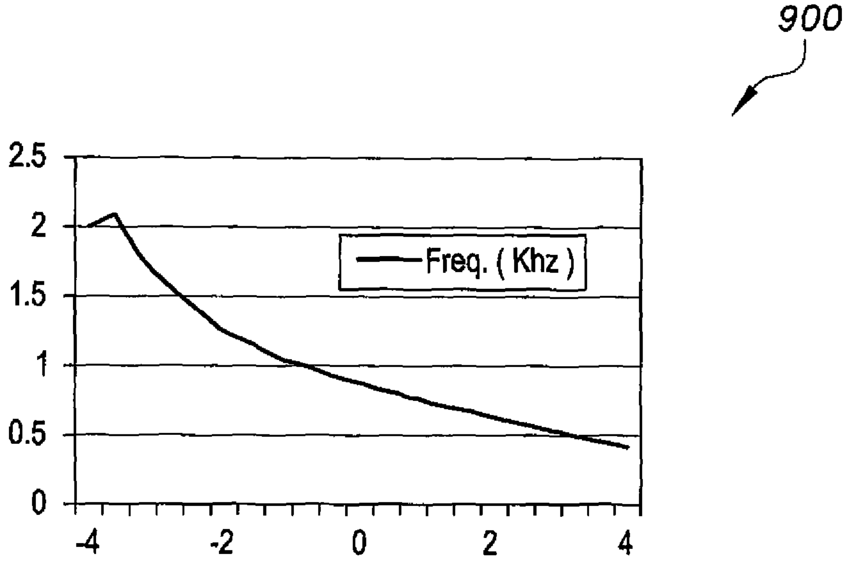
FIG. 9 is a plot showing variation of the frequency of the output voltage of the multivibrator-VCO circuit of FIG. 8.
Figure 10:
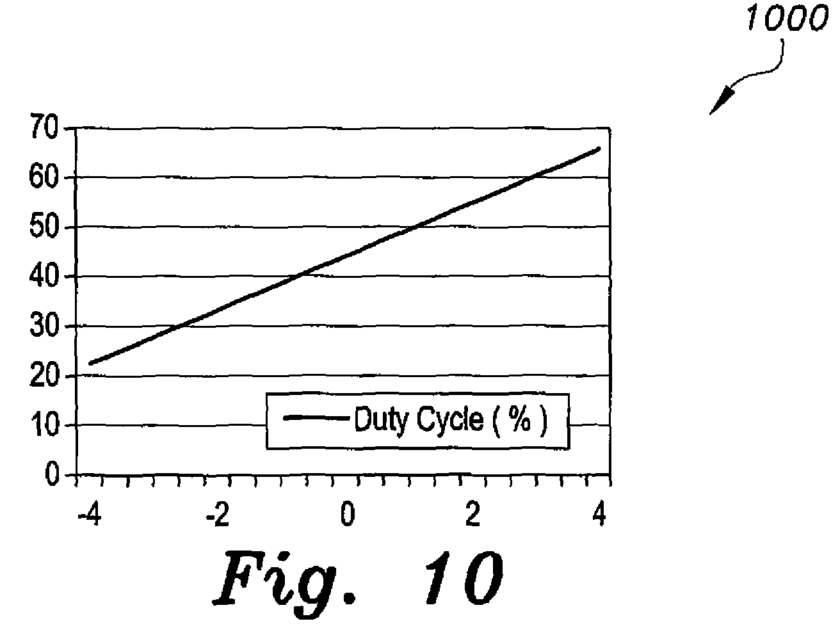
FIG. 10 is a plot showing variation of the duty cycle of the output voltage of the multivibrator-VCO circuit of FIG. 8.

The AND gate 505 of multivibrator circuit 500 is realized using two 2N7000 NMOS transistors, two VP2106 PMOS transistors, and a UA741CN operational amplifier configured as a comparator, as shown in FIG. 6. With $R_1$=5.6kΩ, $V_p$=2.5V, $V_n$=−0.73V, $R_1$ (of circuit 100)=60 kΩ and $V$=−$V_+$= 12V, the waveforms of the output voltage and the voltage across the memristor emulator are shown in plot 700 of FIG. 7. Inspection of plot 700 clearly shows that the circuit of FIG. 5 is acting as a multivibrator circuit generating a rectangular waveform. The duty cycle of this rectangular waveform can be easily controlled by changing $V_p$ and/or, and/or $R_{m1}$, and/or the nonlinear operating point of circuit 100 of FIG. 1. As shown in FIG. 8, a control voltage instead of ground can be connected to $R_{m1}$ of voltage-controlled multivibrator circuit 500. Plots 900 and 1000 of FIGS. 9 and 10 show the variation of the duty cycle of the output rectangular waveform with the control voltage $V_C$. Inspection of plot 900 shows that frequencies up to 2 kHz can be obtained and inspection of plot 1000 shows that it is possible to obtain 50% duty cycle that is a square wave output voltage when the control voltage is around 0.8 V.

It is to be understood that the present invention is not limited to the embodiments described above, but encompasses any and all embodiments within the scope of the following claims.

We claim:

1. A continuous-level memristor emulator circuit, comprising:

a first current feedback operational amplifier (CFOA) having y, x, z and w terminals;

a second CFOA having y, x, z and w terminals, the w terminal of the second CFOA being connected to they terminal of the first CFOA;

an operational transconductance amplifier (OTA) having a negative input, a positive input, and an output, the OTA negative input being connected to the w terminal of the first CFOA, the OTA output being connected to they terminal of the second CFOA;

a resistor $R_3$ connected between ground and they terminal of the second CFOA;

a resistor $R_2$ connected between ground and a control input of the OTA;

a resistor $R_1$ connected between ground and the z terminal of the second CFOA;

a capacitor $C_1$ connected between ground and the z terminal of the first CFOA; and a capacitor $C_2$ connected between ground and the x terminal of the second CFOA.

2. The continuous-level memristor emulator circuit according to claim 1, wherein, given an input current $i_M$ at the x terminal of the first CFOA, a voltage $v_R$ at the negative input of the OTA is characterized by the relation:

$$v_R = -\frac{1}{C_1}\int i_M \, dt.$$

3. The continuous-level memristor emulator circuit according to claim 2, wherein an output current $i_R$ of the OTA is characterized by the relation:

$$i_R = F(v_R) = \frac{v_R}{R_{eq}},$$

where $F(v_R)$ is a nonlinear function representing the input-output relationship of the circuit, including the OTA, resistors $R_2$ and $R_3$, and a DC bias voltage $V_{DC}$. applied to the positive input of the OTA, $R_{eq}$ being an equivalent resistance of the circuit based on a nonlinear operating region of the OTA.

4. The continuous-level memristor emulator circuit according to claim 3, wherein a voltage $v_y$ at terminal y of the second CFOA is characterized by the relation:

$$v_y = i_R R_3.$$

5. The continuous-level memristor emulator circuit according to claim 4, wherein a voltage $v_m$ at terminal x of the first CFOA is characterized by the relation:

$$v_M = R_1 R_3 C_2 \frac{d i_R}{dt}.$$

6. The continuous-level memristor emulator circuit according to claim 5, wherein the equivalent resistance $R_{eq}$ of the continuous-level memristor emulator circuit is further characterized by the relation using variable M, wherein:

$$M = \frac{C_2 R_1 R_3}{C_1 R_{eq}}.$$

7. The continuous-level memristor emulator circuit according to claim 6, further comprising:

a first multivibrator amplifier CFOA2 having x, y, z, and w terminals;

a resistor $R_{m1}$ connected to the x terminal of multivibrator amplifier CFOA2;

a second multivibrator amplifier CFOA1 having x, y, z, and w terminals, the z terminal of multivibrator amplifier CFOA2 being connected to the x terminal of multivibrator amplifier CFOA1, the y terminal of multivibrator amplifier CFOA1 being connected to ground;

a first comparator Comp1 having inverting and non-inverting inputs, and an output;

a second comparator Comp2 having inverting and non-inverting inputs, and an output, the w terminal of the second multivibrator amplifier CFOA1 being connected to the inverting input of the first comparator Comp 1 and to the non-inverting input of the second comparator Comp2, the non-inverting input of the first comparator Comp1 having an applied positive reference voltage $v_p$, the inverting input of the second comparator Comp2 having an applied negative reference voltage $v_n$; and an AND gate having inputs and an output, the output of the AND gate being connected to the y terminal of the first multivibrator amplifier CFOA2, the outputs of the comparators Comp1 and Comp2 being connected to the respective inputs of the AND gate.

8. The continuous-level memristor emulator circuit according to claim 7, wherein the resistor $R_{m1}$ is connected from ground to the x terminal of multivibrator amplifier CFOA2.

9. The continuous-level memristor emulator circuit according to claim 7, wherein the resistor $R_{m1}$ is connected between a control voltage, $V_c$ and the x terminal of the first multivibrator amplifier CFOA2.

* * * * *